(12) United States Patent
Ridderbusch

(10) Patent No.: US 9,698,560 B2
(45) Date of Patent: Jul. 4, 2017

(54) LASER IGNITION SYSTEM

(71) Applicant: Robert Bosch GmbH, Stuttgart (DE)

(72) Inventor: Heiko Ridderbusch, Schwieberdingen (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 15/030,538

(22) PCT Filed: Aug. 25, 2014

(86) PCT No.: PCT/EP2014/067976
§ 371 (c)(1),
(2) Date: Apr. 19, 2016

(87) PCT Pub. No.: WO2015/058886
PCT Pub. Date: Apr. 30, 2015

(65) Prior Publication Data
US 2016/0268767 A1    Sep. 15, 2016

(30) Foreign Application Priority Data

Oct. 23, 2013 (DE) .......................... 10 2013 221 553

(51) Int. Cl.
*H01S 3/11* (2006.01)
*H01S 3/16* (2006.01)
(Continued)

(52) U.S. Cl.
CPC ............ *H01S 3/1698* (2013.01); *F02P 23/04* (2013.01); *H01S 3/0407* (2013.01);
(Continued)

(58) Field of Classification Search
CPC ...... H01S 3/1698; H01S 3/0407; H01S 3/094; H01S 3/11; H01S 3/1696; H01S 3/1618;
(Continued)

(56) References Cited

U.S. PATENT DOCUMENTS

| 5,982,802 A | 11/1999 | Thony et al. |
| 2003/0039274 A1 | 2/2003 | Neev et al. |
| 2007/0064746 A1* | 3/2007 | Winklhofer ............. F02P 23/04 372/10 |

FOREIGN PATENT DOCUMENTS

| DE | 102007044008 A1 | 3/2009 |
| DE | 102007058529 A1 | 6/2009 |

(Continued)

OTHER PUBLICATIONS

International Search Report for PCT/EP2014/067976, issued on Oct. 30, 2014.
(Continued)

*Primary Examiner* — Yuanda Zhang
(74) *Attorney, Agent, or Firm* — Norton Rose Fulbright US LLP; Gerard Messina

(57) ABSTRACT

A laser ignition system, in particular for an internal combustion engine, including a vertical emitter and a laser-active crystal, the laser-active crystal being doped in at least some areas using ytterbium, the ytterbium-doped area having a length of 200 μm to 7000 μm. The monolithic laser is based on a YAG or LuAG host crystal having 3 differently doped areas: a laser-active ytterbium-doped area, an undoped area which determines the resonator length and therefore the pulse duration, and a chromium-doped or vanadium-doped area for the passive Q-switch. The resonator is delimited by 2 mirrors.

7 Claims, 1 Drawing Sheet

(51) Int. Cl.

| | | |
|---|---|---|
| *F02P 23/04* | (2006.01) | |
| *H01S 3/06* | (2006.01) | |
| *H01S 3/04* | (2006.01) | |
| *H01S 3/08* | (2006.01) | |
| *H01S 3/094* | (2006.01) | |
| *H01S 3/0941* | (2006.01) | |
| *H01S 3/113* | (2006.01) | |
| *H01S 5/183* | (2006.01) | |

(52) U.S. Cl.
CPC .......... *H01S 3/0612* (2013.01); *H01S 3/0627* (2013.01); *H01S 3/094* (2013.01); *H01S 3/11* (2013.01); *H01S 3/164* (2013.01); *H01S 3/1618* (2013.01); *H01S 3/1643* (2013.01); *H01S 3/1696* (2013.01); *H01S 3/08* (2013.01); *H01S 3/09415* (2013.01); *H01S 3/094084* (2013.01); *H01S 3/113* (2013.01); *H01S 5/183* (2013.01)

(58) Field of Classification Search
CPC ...... H01S 3/164; H01S 3/0627; H01S 3/0612; H01S 3/1643; H01S 3/113; H01S 3/09415; H01S 3/094084; H01S 3/08; H01S 5/183; F02P 23/04
See application file for complete search history.

(56) References Cited

FOREIGN PATENT DOCUMENTS

| | | |
|---|---|---|
| DE | 102009029652 A1 | 3/2011 |
| DE | 102010042453 A1 | 4/2012 |
| DE | 102010043058 A1 | 5/2012 |
| DE | 102010061891 A1 | 5/2012 |

OTHER PUBLICATIONS

Tsunekane et al., "High Peak Power, Passively Q-Switched Yb: YAG/Cr: YAG Micro-Lasers", IEEE Journal of Quantum Electronics, vol. 49, No. 5, May 1, 2013, pp. 454-461.

* cited by examiner

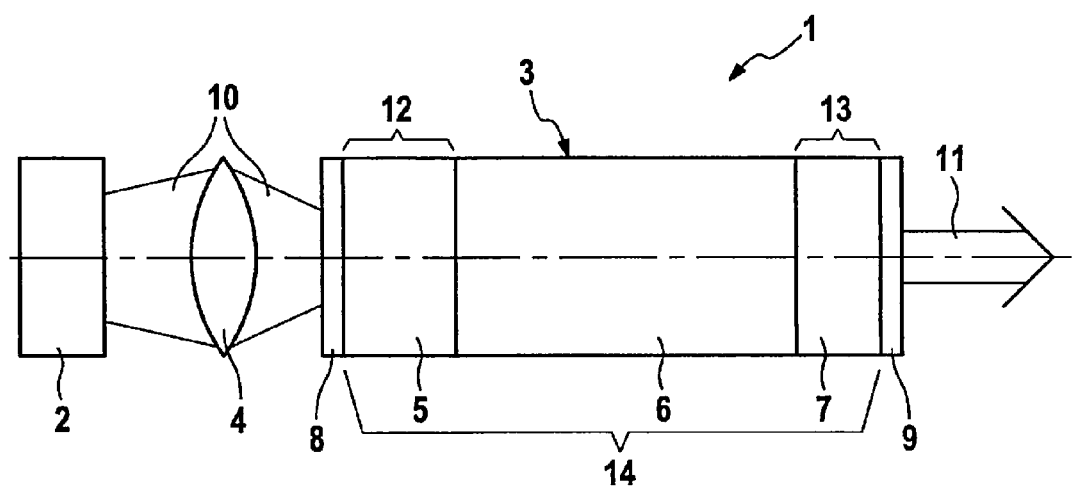

LASER IGNITION SYSTEM

FIELD

The present invention relates to a laser ignition system, in particular for an internal combustion engine, including a vertical emitter and a laser-active crystal.

BACKGROUND INFORMATION

In present laser ignition applications, monolithically constructed neodymium (Nd)-doped solid-state lasers having a passive Q-switch are frequently used as the beam source. Either edge-emitting semiconductor lasers, also referred to as edge emitters, which introduce the pump light into the solid-state laser transversely or longitudinally, optionally via an optical fiber, or vertically-emitting semiconductor lasers, also referred to as VCSEL or vertical emitters, having a longitudinal pump light arrangement, as described in German Patent Application No. DE 10 2010 042 453 A1, are used as the pump light source.

Alternatively to the neodymium-doped solid-state laser, ytterbium (Yb)-doped solid-state lasers may also be used. Fiber-coupled edge emitters are used as the pump light source for ytterbium-doped solid-state lasers.

It was shown in the German Patent Application 102013202184.4 (unpublished) that for good ignition, measured on the combustion stability and the lean burning capacity of the air-gas mixture to be ignited, not only is the pulse energy in the ignition point decisive, but rather also the shape of the ignition laser beam is significant for the plasma formation and ignition of the air-gas mixture to be ignited. One measure for the shape of the ignition laser beam is beam quality $M^2$. As a result of the smaller effective cross section in the stimulated emission of ytterbium-doped solid-state lasers in comparison to neodymium-doped solid-state lasers, ytterbium-doped solid-state lasers have a fundamentally better beam quality $M^2$.

SUMMARY

It is an object of the present invention to improve laser ignition systems of the type mentioned at the outset in such a way that they are long-lived, cost-effective, and efficient and reliable with respect to the plasma formation and the ignition of the air-gas mixture to be ignited.

This object may be achieved in laser ignition systems of the type mentioned at the outset according to the present invention in that the laser-active crystal is doped in at least some areas using ytterbium, the ytterbium-doped area having a length of 200 µm to 7000 µm.

The provision according to the present invention of pumping a laser-active crystal having an ytterbium-doped area with the aid of a vertical emitter has the advantage that a laser ignition system having high efficiency and high ignition reliability is obtained. As mentioned at the outset, for good plasma formation and good ignition of the air-gas mixture to be ignited, not only the pulse energy in the ignition point, but rather also the shape of the ignition laser beam are significant. By way of the use of an ytterbium-doped laser-active crystal having potentially better beam quality $M^2$ than comparable neodymium-doped laser-active crystals in combination with a vertical emitter, which has a circular intensity profile and in particular also good beam quality $M^2$, a laser ignition system is obtained having good focusing capability, which reliably ignites the air-gas mixture to be ignited.

In addition, vertical emitters are very robust and therefore long-lived and also cost-effective in the medium term. Furthermore, the diameter of an ytterbium-doped laser-active crystal may be selected to be smaller, as a result of the small active cross-section for stimulated emission, than in the case of neodymium-doped laser-active crystals and manufacturing costs of the laser-active crystal may thus be saved.

As a result of the brilliance (=power/(area*spatial angle)), which is less by approximately an order of magnitude, of the vertical emitter in comparison to an edge emitter, it may be advantageous if the ytterbium-doped area of the laser-active crystal has a high Yb-doping, so that the solid-state laser may be pumped homogeneously. The Yb-doped area of the laser-active crystal has, for example, a Yb-doping of not less than 3 at %, in particular not less than 7 at %. The Yb-doping is preferably not greater than 30 at %, in particular not greater than 20 at %. The doping concentration is selected to be sufficiently high that the absorption length of the pump light is only several hundred micrometers to several millimeters long and corresponds to approximately half of the Rayleigh length of the pump light. The Rayleigh length of the pump light is, for example, in the range of 200 µm to 10,000 µm in the Yb-doped area of the laser-active crystal.

The length of the Yb-doped area in the laser-active crystal is adapted to the absorption length and the Rayleigh length of the pump light. The Rayleigh length is the distance along the optical axis, at which the cross-sectional area of the laser beam has doubled its size proceeding from the beam waist.

The Yb-doped area, also referred to as the first area hereafter, is not shorter than 200 µm, in particular not shorter than 300 µm. The first area is preferably not longer than 7000 µm, in particular not longer than 5000 µm. The length of the first area is advantageously adapted to the doping concentration of the ytterbium and also to the absorption length and the Rayleigh length of the pump light, so that, on the one hand, all of or not less than 68% of the pump light is absorbed in the first area and, on the other hand, the first area is not longer than necessary so that no material is wasted. A YAG crystal or a LuAG crystal may be used as the host crystal for the first area.

In one advantageous specific embodiment, it is provided that the laser-active crystal has a total length of not less than 5 mm. The laser-active crystal is preferably not longer than 50 mm. In particular, the total length of the laser-active crystal may be in the range from 10 mm to 40 mm, in particular in the range from 15 mm to 30 mm.

In one refinement, the laser-active crystal has at least one second area in addition to the Yb-doped first area. In particular, the laser-active crystal may have three areas. The laser-active crystal having these areas is preferably entirely or at least partially formed as a monolith, i.e., the areas are integrally joined to one another, for example, by wringing together or bonding.

In one refinement, the second area of the laser-active crystal is essentially undoped, essentially meaning that the second area of the laser-active crystal was not intentionally doped and only has the typical manufacturing-related contaminants. By way of the combination of doped and undoped areas in the laser-active crystal, the robustness of the laser-active crystal and therefore also of the entire laser ignition system is increased, since no further resorption of the pump light takes place in the undoped area, in contrast to the Yb-doped area.

In one refinement, the third area of the laser-active crystal has a chromium ($Cr^{4+}$) or vanadium ($V^{3+}$) doping. For example, a YAG crystal or a LuAG crystal is used as the host crystal.

In one refinement, the third area has the function of a passive Q-switch. A saturable absorber is used for this purpose, which only switches upon reaching a saturation intensity, i.e., becomes transmissive to the incident laser radiation or emits a laser pulse. The saturable absorber absorbs the incident laser radiation, the absorption coefficient being dependent on the intensity, the initial absorption, and the saturation intensity. The initial absorption and therefore also the initial transmission are dependent on the absorber concentration, i.e., the concentration of, for example, the $Cr^{4+}$ or $V^{3+}$ doping in the host crystal. The initial transmission of the passive Q-switch or the saturable absorber is not to be less than 30% and/or not greater than 98%. If the amplification (gain) is greater than the resonator-internal losses, the population inversion decays in the upper laser level and the solid-state laser emits a laser pulse. After a certain relaxation time of several microseconds, the saturable absorber is again strongly absorbent for the resonator-internal stimulated laser radiation.

A $V^{3+}$ doping of the third area has the advantage that due to the smaller absorption cross section of the first excited state of the passive Q-switch, less stimulated emission is absorbed and therefore the overall efficiency may be higher.

The length of the third area is greater than 50 μm, in particular greater than 100 μm, so that the thermal lens is not formed as strongly by the absorption of the stimulated radiation in the passive Q-switch.

Fundamentally, a GGG host crystal and/or a GSGG host crystal may be used as the laser-active crystal alone or in combination with a YAG host crystal and/or a LuAG host crystal, a YAG crystal and/or a LuAG crystal being preferred as the host crystals over the other two crystals.

The same host crystal is preferably used for at least two areas. The use of the same host crystal in all three areas has the particular advantage that there are no connection points between the different host crystals. If at least two different host crystals are used, the combination of YAG crystal and LuAG crystal is preferred, since both crystals may be connected (bonded) well.

The vertical emitter is preferably able to emit pump light having a wavelength of 935 nm to 945 nm or alternatively a wavelength in the range of 965 nm to 985 nm.

In one refinement, the laser ignition system may have a resonator, which includes at least two resonator mirrors. The resonator mirrors are situated, for example, in front of or behind the front ends, i.e., the sides facing toward and facing away from the pump light source, of the laser-active crystal, for example, in the form of coatings directly on the front ends of the laser-active crystal.

Further features, possible applications, and advantages of the present invention result from the following description of exemplary embodiments of the present invention, which are illustrated in the figures.

BRIEF DESCRIPTION OF THE DRAWING

FIG. 1 shows an example of a laser ignition system according to the present invention.

DETAILED DESCRIPTION OF EXAMPLE EMBODIMENTS

FIG. 1 shows a schematic illustration of laser ignition system 1 according to the present invention, which includes a pump light source and a solid-state laser 3. The associated electrical lines for the power supply of pump light source 2, and details of the structural embodiment of laser ignition system 1 as a laser spark plug, which are described, for example, in European Patent No. EP 1 519 038 A1, are not shown. Means are optionally provided for the optical transmission of laser beam 11 or pump light 10. Furthermore, a thermal line, in particular for cooling liquid, may be provided for cooling pump light source 2 and/or solid-state laser 3 and/or other components. Possible means for installing laser ignition system 1 on an internal combustion engine are also not shown. Furthermore, for example, the joint arrangement of pump light source 2 and solid-state laser 3 in a housing and/or at least one means for optical imaging of emitted laser beam 11 in the combustion chamber of an internal combustion engine and/or a combustion chamber window, which separates laser ignition system 1 and the means for optical imaging from the combustion chamber, are not shown.

In this exemplary embodiment, a vertical emitter is used as pump light source 2 for solid-state laser 4. The vertical emitter emits pump light 10 having the wavelength of 940 nm or in the range from 970 nm to 980 nm. The specifications of the wavelength are to be understood to include the uncertainties typical in laser technology. Pump light 10 is focused by a pump light lens 4 onto solid-state laser 3. Pump light lens 4 has an antireflective coating for the pump light wavelength used.

Solid-state laser 3, which is shown in this exemplary embodiment, includes a laser-active crystal, which has three differently doped, i.e., partially doped and partially undoped, areas 5, 6, 7, and two resonator mirrors 8, 9. The monolithically formed laser-active crystal is doped using ytterbium in first area 5. Second area 6 is essentially undoped, essentially meaning that the host crystal was not intentionally doped and only has the typical manufacturing-related contaminants. Third area 7 is doped using $Cr^{4+}$ or $V^{3+}$.

A YAG crystal is typically used as the host crystal. In an alternative exemplary embodiment, a LuAG crystal may instead also be used as the host crystal.

First area 5 has an ytterbium-doping of 3 at % to 30 at % in a YAG crystal or a LuAG crystal. Length 12 of first area 5 is in the range from 200 μm to 7000 μm.

Second area 6 has a length in the range of 4 mm to 49 mm.

Third area 7 is used as a passive Q-switch. The initial transmission of the passive Q-switch is not less than 30%. The initial transmission is preferably not greater than 98%.

Length 13 of third area 7 is longer than 50 μm, in particular longer than 100 μm. In an alternative exemplary embodiment, length 13 of third area 7 may also not be longer than 150 μm.

Total length 14 of laser-active crystal 3, without resonator mirrors 8, 9, is in the range from 5 mm to 50 mm.

First resonator mirror 8 is located in the form of a coating on the front end of the laser-active crystal facing toward pump light source 2. First resonator mirror 8 is highly transmissive for the wavelength of pump light source 2 and highly reflective for the wavelength of solid-state laser 3.

Second resonator mirror 9 is also located as a coating on the front end of the laser-active crystal facing away from pump light source 2. Second resonator mirror 9 is highly reflective for the wavelength of pump light source 2 and partially reflective for the laser wavelength of solid-state laser 3. The reflection of second resonator mirror 9 is in the range from 8% to 90%.

One alternative embodiment provides only one resonator mirror 8 on the side of the laser-active crystal facing toward the pump light source. Second resonator mirror 9 is omitted, so that no further reflection takes place except at the interface between the side of the laser crystal facing away from pump light source 2 and the air. A laser ignition system 1 having improved robustness and simplified construction results. The reflectivity at the interface of, for example, a YAG crystal (n=1.82) to air (n=1) is approximately 8%.

What is claimed is:

1. A laser ignition system for an internal combustion engine, comprising:
 a vertical emitter used as a pump light source; and
 a laser-active crystal having three areas, the laser-active crystal being doped in at least some of the three areas using ytterbium;
 wherein the laser-active crystal is at least in areas at least one of: i) a YAG host crystal, ii) a LuAG host crystal, iii) a GGG host crystal, and iv) a GSGG host crystal,
 wherein a first area is an ytterbium-doped area,
 wherein a second area of the laser-active crystal is essentially undoped,
 wherein a third area of the laser-active crystal is doped using chromium ($Cr^{4+}$) or vanadium ($V^{3+}$),
 wherein the area which is doped using ytterbium has an ytterbium doping of 3 at % to 30 at %,
 wherein the third area is a passive Q-switch and has an initial transmission of not less than 30% for the wavelength generated in the laser-active material,
 wherein the vertical emitter is able to emit a wavelength in a range from at least one of: i) 935 nm to 940 nm, and ii) 965 nm to 985 nm,
 wherein the laser ignition system has a resonator which is delimited by a first resonator mirror and a second resonator mirror,
 wherein the first resonator mirror is located in the form of a coating on a front end of the laser-active crystal facing toward the pump light source,
 wherein the second resonator mirror is located as a coating on a front end of the laser-active crystal facing away from the pump light source,
 wherein the first area has a length in the range of about 200 μm to about 7000 μm,
 wherein the second area has a length in the range of about 4 mm to about 49 mm,
 wherein the third area has a length in the range of about 50 μm to about 150 μm,
 wherein the laser-active crystal, excluding the first resonator mirror and the second resonator mirror, has a total length of 5 mm to 50 mm, and
 wherein the Yb-doping concentration is selected to be sufficiently high so that the absorption length of the pump light source is 200 μm to about 7000 μm long and corresponds to approximately half of a Rayleigh length of the pump light source.

2. The laser ignition system as recited in claim 1, wherein the ytterbium-doped area has a length of 300 μm to 5000 μm.

3. The laser ignition system as recited in claim 1, wherein at least three areas of the laser-active crystal have the same host crystal.

4. The laser ignition system as recited in claim 1, wherein the third area has a length of greater than 100 μm.

5. The laser ignition system as recited in claim 1, wherein the laser ignition system is configured as a laser spark plug having at least one of an electrical line, an optical line, and a thermal line.

6. The laser ignition system as recited in claim 1, wherein the laser ignition system is configured as a laser spark plug having at least one of: i) an arrangement for installation on an internal combustion engine, and ii) an arrangement for optical imaging of an emitted laser beam into a combustion chamber of an internal combustion engine.

7. The laser ignition system as recited in claim 1, wherein the laser ignition system is configured as a laser spark plug having a line for a cooling liquid for cooling at least one of the pump light source and the laser active crystal.

* * * * *